(12) United States Patent
Malone et al.

(10) Patent No.: US 6,218,218 B1
(45) Date of Patent: *Apr. 17, 2001

(54) METHOD FOR REDUCING GATE OXIDE DAMAGE CAUSED BY CHARGING

(75) Inventors: Farris D. Malone, Richardson; Sima Salamati-Saradh, Plano, both of TX (US); Ingrid G. Jenkins, Silver Spring, MD (US); David R. Wyke, Carrollton; Mary C. Adams, DeSoto, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,479

(22) Filed: Jun. 19, 1997

Related U.S. Application Data

(60) Provisional application No. 60/020,002, filed on Jun. 21, 1996.

(51) Int. Cl.$^7$ .......................... H01L 21/325; H01L 21/31
(52) U.S. Cl. .......................... 438/142; 438/763; 438/788; 438/910; 427/569; 427/579
(58) Field of Search .................................. 438/142, 763, 438/788, 789, 910; 427/248.1, 96, 99, 255, 569, 579

(56) References Cited

U.S. PATENT DOCUMENTS

| 5,286,518 | * | 2/1994 | Cain et al. ........................... 427/579 |
| 5,665,203 | * | 9/1997 | Lee et al. ............................. 437/57 |
| 5,670,432 | * | 9/1997 | Tsai ..................................... 427/99 |
| 5,700,711 | * | 12/1997 | Hsu et al. ............................ 437/60 |
| 5,716,875 | * | 2/1998 | Jones, Jr. et al. ...................... 438/3 |
| 5,779,925 | * | 7/1998 | Hashimoto et al. ................ 427/571 |
| 5,913,140 | * | 6/1999 | Roche et al. ......................... 438/624 |

* cited by examiner

Primary Examiner—Shrive Beck
Assistant Examiner—Bret Chen
(74) Attorney, Agent, or Firm—Jacqueline J. Garner; Wade James Brady, III; Frederick J. Telecky, Jr.

(57) ABSTRACT

A method of processing wafers containing a gate oxide assembly (10) is disclosed that reduces gate oxide damage during wafer production due to damage caused by charging. The method comprises creating an oxide gate assembly (10) on a silicon layer (11) in a production line chamber followed by the deposition of a polysilicon layer (22). Following the creation of the gate oxide assembly (10) a pressure of at least 1.2 Torr is maintained while lowering the power within the production line chamber. The invention can be used with a gate oxide layer (16) of less than 1000 angstroms.

19 Claims, 1 Drawing Sheet

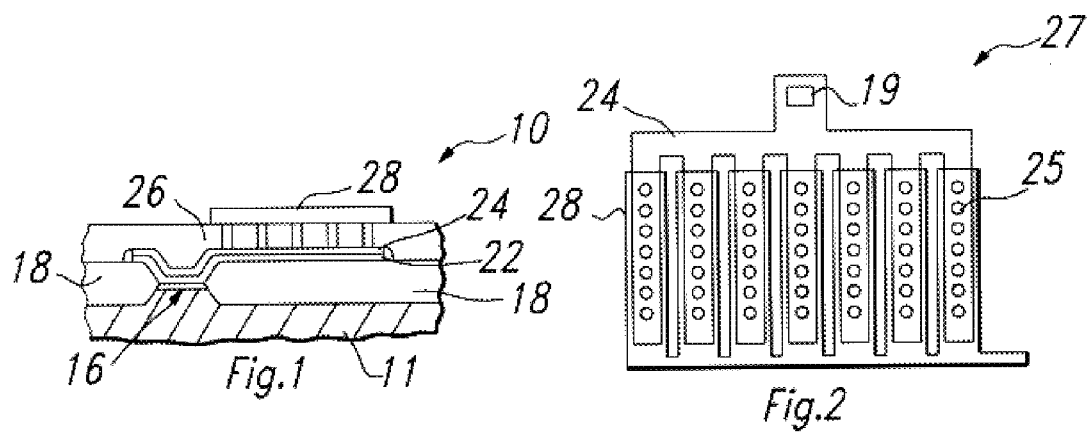
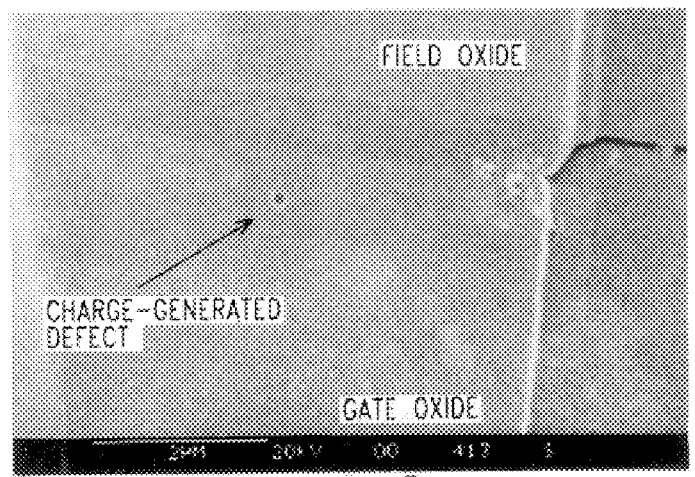
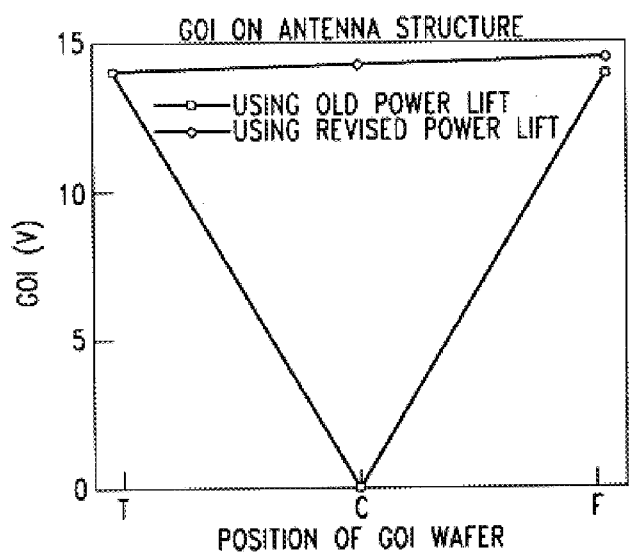

METHOD FOR REDUCING GATE OXIDE DAMAGE CAUSED BY CHARGING

This application claims the benefit of Provisional No. 60/020,002 filed Jun. 21, 1996.

TECHNICAL FIELD OF THE INVENTION

This invention relates, in general, to an improved method for reducing the problems caused by electrostatic charging during the wafer manufacturing process, and in particular, to a method that reduces the failure of gate oxides created when charges within a wafer cause damage to the gate oxide during a subsequent polysilicon deposition process.

BACKGROUND OF THE INVENTION

Without limiting the scope of the invention, its background is described in connection with MOS technologies, as an example.

As MOS technology advances, increasingly thinner gate oxide layers are required. With thinner layers comes an increased demand for improved efficiency, decreased failure rates, and greater control over the process. One problem that is widely recognized in the wafer manufacturing process is gate oxide charging. Several steps in the process have been implicated in the charging process, including: ion implantation, ashing, surface scrubbing, and etching.

Gate oxide damage may also occur during the subsequent deposition of an oxide layer. For example, damage due to a plasma enhanced TEOS or silicate deposition, leading to degradation in hot carrier lifetime, has been reported to vary with the thickness of the oxide layer deposited. Gate oxide damage has been shown to be reduced by a protective layer of polysilicon with a thickness of 150 nm. The 150 nm polysilicon layer was reported to block charging effects during subsequent processing.

The conventional theory of plasma-charging damage, on the other hand, relies strongly on the antenna's ability to collect charges from the plasma. In contrast, a process known as "photoconduction" has been proposed as a mechanism for charging damage that increases as the thickness of the deposition film increases.

Both theories, however, fail to explain the continuously increasing damage as more dielectric is deposited. The failure of the photoconduction theory is particularly true since even a thin layer of dielectric can prevent the antennae from further charging.

Alternatively, others have proposed that the correlation between charging and oxide deposition indicates that the thickness of the layer causes a "photocurrent" to fall off quickly as the inverse square of the distance that the photons have to travel. In the vertical direction, the fall off would be even faster because less photons would penetrate the thickness of the oxide.

Therefore, the current understanding in the field is that thickness dependent damage and the effect of saturation is a combination of the photocurrent fall off and damage saturation, whether the photocurrent does or does not fall off. Furthermore, the photocurrent fall off would also make the photoconductive effect a very local phenomenon.

SUMMARY OF THE INVENTION

It has been found that gate oxide charging during the wafer manufacturing process leads to high failure rates. The need for eliminating gate oxide failure caused by wafer charging has become increasingly important because gate oxide layers are being made thinner and thinner. What is needed, therefore, is a method of plasma enhanced oxide deposition that prevents circuit failure caused by charging effects.

The present invention provides a method of eliminating the conditions that cause gate oxide damage during the post polysilicon gate oxide deposition. In this regard, the present invention comprises maintaining the internal pressure within a production line chamber until the power level within the chamber drops below a specified level. Maintaining the pressure within the plasma enhanced production line during power down remedies the impact of charging, which otherwise creates catastrophic damage impacting on the reliability of the oxide. Furthermore, the present invention reduces the gate oxide damage that occurs during oxide deposition, which is caused by inefficient lateral discharging of the layer following deposition of the polysilicon layer.

Although a variety of assembly lines have been used in the art, the invention can be used to solve a problem common to all like-production assembly lines. The present invention can be used with all like-production assembly lines, as they are programmed by the manufacturer to reduce the pressure within the production line chamber following the TEOS deposition step, also known as the power lift step. The post oxide deposition step is used to release the wafer from the electrostatic charging that occurs during the wafer manufacturing process.

Another aspect of the present invention is to allow for continued use of any of the processing gases used in the art of plasma deposition. The present invention can use a production line chamber processing gas such as TEOS gas, during the creation of the gate oxide assembly. Other gases, such as silane, may also be used with the present invention.

The present invention solves the failure rate caused by charging during the manufacturing of wafers and improves the gate oxide quality of finished products. The present invention was used to discover the mechanism of charging, mainly the drop in pressure during the post oxide deposition step.

These and other features of the invention that will be apparent to those skilled in the art from the following detailed description of the invention, taken together with the accompanying drawings.

DESCRIPTION OF THE DRAWINGS

In the drawings:

FIG. 1 is a schematic drawing of a typical gate assembly, including the deposited layers;

FIG. 2 is a schematic drawing of an antenna assembly;

FIG. 3 is an electronmicrograph of charged induce damage following oxide deposition;

FIG. 4 is a graph showing the difference between gate oxide induced failure, with or without the power lift step, and the relative position of the failure on the wafer.

Corresponding numerals and symbols in different figures refer to corresponding parts unless otherwise specified.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

In FIG. 1, a typical gate oxide assembly is shown and generally denoted as 10. The first layer in FIG. 1 is a silicon layer 11 that is, or is part of, a silicon wafer. Over silicon layer 11, a thin layer of gate oxide 16 is grown. The thickness of the gate oxide layer 16 will depend on the particular application of the gate oxide assembly 10. For example, depending on the type of transistor for which the gate oxide assembly 10 is designed, the thickness of gate oxide layer 16 can be of any thickness. In one embodiment of the present invention the thickness of the oxide layer 16 is less than 1000 angstroms. The polysilicon gate may be polysilicon or polysilicon overlaid with a layer of silicide. Alternatively, the polysilicon may be doped with phosphorous or boron. The silicide is formed by reacting a metal, for example, Ti or W, with the polysilicon or by depositing the silicide layer on the polysilicon. For most applications for use with the present invention the thickness of the gate oxide layer 16 is less than 1000 angstroms.

Prior to the gate oxide growth, a filed oxide 18 is grown to provide electrical isolation. Deposited over field oxide layer 18, and coming in contact with the gate oxide layer 16, is a layer of polysilicon 22. Alternatively, polysilicon layer 18 can be a polysilicon layer overlaid with a silicide layer, known as a polysilicon/silicide stack. Specifically, the polysilicon layer 22 may be a TEOS or PETEOS polysilicon. A layer of tungsten silicide 24 is shown deposited over the polysilicon layer 22. Alternatively, the tungsten silicide layer 24 can be a polysilicide or a dope polysilicon layer. A further layer of MLO oxide 26 is shown placed over the tungsten silicide layer 24. Finally, traversing the MLO oxide layer 26 is a metal coupling 28 that comes in contact with the tungsten silicide layer 24.

In FIG. 2, a top view of a typical antenna assembly 27 is depicted. A metal coupling layer 28 in the form of finger-like projections is disposed, in an opposite direction, from tungsten silicide 24 a finger-like sublayer. Connecting the metal coupling layer 28 and the tungsten silicide sublayer 24 are vias 25. The finger-like tungsten silicide sublayer 24 comes in contact with a gate oxide island at the opposite end of the interconnection of the metal coupling layer 28 and the tungsten silicide sublayer 24.

FIG. 3 is an electronmicrograph of damage to the gate oxide caused by charging in the enhanced plasma deposition chamber without the use of the present invention. The scale shown in the bottom of the figure is 2 $\mu$m. These charge generated defects are responsible for the gate oxide integrity defects produced during the power lift in the production chamber.

FIG. 4 is a comparison of gate oxide integrity (GOI), produced with and without the method of the present invention. The production line was an Applied Materials P5000 production line using the equipment manufacturer's specifications and installation. The figure demonstrates the reduction in failures due to a lack of charging by using the method of the present invention during the post oxide deposition power lift step. FIG. 4, therefore, shows that by using the revised high pressure post oxide deposition power lift method of the present invention, the amount of gate oxide integrity breakdown is decreased to about zero in the center of the wafer and greatly reduced damage from charging resulted.

Specifically, the improved method of the present invention comprises maintaining the pressure in a production line chamber above a specified pressure. A specified pressure for use with the present invention is about of above 1.2 Torr following the deposition of a TEOS layer. The specified pressure can be used during the power lift step. More specifically, it is an object of the present invention to solve the critical problem of assembly line damage caused by electrostatic charging following the deposition of an oxide layer by maintaining the specified pressure in the production line chamber at a pressure at or above 1.2 Torr. This specified pressure may be used throughout the processing of gate oxide assemblies, like gate oxide assembly 10. Specifically the specified pressure is maintained during a post oxide deposition step. The post oxide deposition step can be a power lift step. In another embodiment of the present invention the pressure is maintained about or above 1.2 Torr until electrical power is reduced to at least 50 Watts in the production line chamber.

Therefore, it is an embodiment of the present invention to maintain pressure within the production line chamber at the specified pressure throughout the oxide deposition process. In one embodiment of the invention the pressure is about 1.2 Torr. Another embodiment of the invention is to maintain a pressure of about 1.5 Torr during the plasma enhanced deposition step in the production line chamber.

The invention can be used with any of the production lines available for wafer production. In one embodiment of the present invention is the use of an Applied Materials P5000 production line. However, all like-production lines can be used with the invention. What is meant by all like-production assembly lines within the scope of the present invention, are production lines that use plasma enhanced deposition. Furthermore, the method of the present invention can be used following an oxide deposition step that produces an oxide layer having a thickness less than 1000 angstroms.

In another embodiment of the present invention a processing gas may be used in the polysilicon plasma deposition step. In one embodiment of the present invention, the gas used in the processing chamber is TEOS gas. In yet another embodiment, of the present invention the processing gas is silane.

Yet another embodiment of the present invention is a method of reducing charging damage that involves maintaining the pressure within the chamber of a production line, such as an Applied Materials P5000 production line, about or above 1.2 Torr wherein the steps performed within the production chamber comprise: a setup step, where for example, a gate oxide assembly is created; a polysilicon deposition step; and a power lift step. In one embodiment, the pressure in the production line chamber is maintained about or above 1.2 Torr during, specifically, the power lift step.

For example, a variety of tools to detect damage by charging have been developed over the last decade. Large area capacitors (approx. 0.15 cm²) were initially used, allowing for the gate oxide integrity (GOI) breakdown distribution to be effectively determined. Depending upon the monitor sensitivity (polysilicon terminating on moat or on field oxide), cleanup, furnace issues and LOCOS processing can be effectively monitored. The large area capacitor can be used to monitor QBD (breakdown charge). Alternatively, another detector for use with the present invention is a small capacitor. A quasistatic evaluation of a capacitor can also be monitored for DIT (density of interface traps) values or for changes in DIT. The monitor used herein for detecting charging has been the antenna structure.

The antenna monitor can have one or more capacitors that vary in antenna (collector) to moat (discharge) area ratios. This antenna monitor is a highly effective tool for detecting process/equipment charging. Under these conditions a charge on an isolated gate can be monitored for indications of damage. The MOS transistor can also be monitored for increases in the substrate current. The following example demonstrates the use of the antenna structure.

Using the present invention the process parameters and their contributions toward gate oxide damage were detailed, and an explanation of the charging mechanism was found. The identification of the mechanism of charging lead to the identification of the improved methods of the present invention for improving processing efficiency, decreasing failure rates and allows for greater control over the device the processing and equipment used for processing wafers.

In operation, N-100 wafers having a resistivity of 15 ohm-cm were processed through a pad oxide of 20 nm and a Silicon Nitride deposition of 140 nm. After a photolithography pattern is placed, the Silicon Nitride was removed by plasma etching. The wafers were cleaned in a piranha solution and an SC2 clean preceded a field oxidation of 0.60 $\mu$m. Following excess Silicon Nitride removal and a dummy gate oxidation of 30 nm, the oxide was removed and an SC2 clean preceded the growth of the gate oxide of 13 nm. The gate oxide was grown using a dry-wet-dry routine (the dry segments were 02 and 4% HCl). The photolithography patterns of a charging monitor were used (capacitor antenna structures having ratios of 100/1 up to 7500/1). A polysilicon layer of 0.2 $\mu$m and a tungsten silicide layer of 0.25 $\mu$m were deposited for the gate electrode and a plasma etch removed the excess gate material after the patterning operation. The wafers were ashed to remove the photoresist. A 0.30 $\mu$m TEOS film was deposited and then etched to form sidewalls. The wafers were probed at post sidewall etch to insure the integrity of the gate oxide at that point.

A 30 nm plasma enhanced oxide was deposited in an Applied Materials P5000 reactor. In the normal CMOS routing this oxide is used as a screening oxide for the ion implant of the source and drain. The thickness of the deposited oxide was varied along with process parameters for each of the deposition thicknesses to determine the sensitivity to charging. The recipe for the oxide deposition generally consists of three major steps: 1) setup, 2) deposition and 3) power lift.

The power lift is a step designed to insure that the wafer releases from any electrostatic bonding to the substrate, and is standard in the industry. Variations in RF power, temperature of substrate, were made along with variations in the thickness of the deposited film (0.03–1.1 $\mu$m). Some splits included removal of selected steps in the process.

Additional details of the process are given in Table 1. After the oxide was deposited, the wafers were processed through a contact oxide removal. The contacts were wet etched so as not to confuse any dry etching issues with the deposition under investigation. Wafers were then probed on a 450 Keithley tester for GOI values. 16 sets of antenna ratio capacitors were evaluated. The ratios of polysilicon moat to oxide gate ranged from 100/1 to 7500/1.

TABLE 1

| | Deposition Process | | |
|---|---|---|---|
| Parameter | Setup | Deposition | Power-Lift |
| Time (Sec) | 15 | Variable | 20 |
| Pressure (Torr) | 9 | 9 | <1 |
| RF Power (W) | 0 | 500 | 50 |
| Temp (C) | 390 | 390 | 390 |
| Spacing (cm) | 0.508 | 0.508 | 1.98 |

The voltage needed to produce 1 nA of current, Vlf, was used as a criteria for determining oxide failure. A drop of 5% in Vlf was deemed a failure. Some of the legs of the test matrix produced charging, with the centers of the wafers being 2s predominantly affected. The current-voltage characteristics of the failed capacitors were found to be near shorts, as expected since the starting material was N-type. The charging on the capacitors having antenna ratios of 2500/1 and greater.

Table 2 demonstrates that charging occurred on all sections of the test, except, when the deposited oxide was thick or the power lift step was omitted. Note that in Table 2 there is a correlation of failures to deposited oxide thickness. The data show that there is less damage due to charging as the deposited oxide becomes thicker. This indicates that the charging occurs at the end of the process, after the oxide had been deposited. The failures typically occurred in the center of the wafer on the ratio capacitors of 2500/1 and above.

TABLE 2

| | Number of Capacitors Showing Vlf Failures | | | |
|---|---|---|---|---|
| Antenna Ratio | 30 nm TEOS | 100 nm TEOS | 1.1 $\mu$m TEOS | 30 nm TEOS (w/o Power lift) |
| 7500/1 | 5 | 1 | 0 | 0 |
| 5000/1 | 3 | 0 | 0 | 0 |
| 2500/1 | 1 | 0 | 0 | 0 |
| 1000/1 | 0 | 0 | 0 | 0 |

Both the removal of the Power Lift step and the oxide thickness sensitivity indicated that the charging was occurring during the power lift step of the depositions. Additional studies were undertaken to determine the mechanism underlying the oxide deposition damage. Variations were made to the spacing, pressure and temperature at the Power Lift step. Table 3 demonstrates the results. To control for the thickness of the deposited film, this thickness was held at 30 nm.

TABLE 3

| Antenna Ratio | Pressure (Torr) | | | Temp (C.) | | Spacing (w/o Power Lift) | |
|---|---|---|---|---|---|---|---|
| | 0.6 | 1.5 | 7.0 | 390 | 430 | 1.79 | 1.98 |
| 7500/1 | 5 | 0 | 0 | 0 | 0 | 0 | 0 |
| 5000/1 | 3 | 0 | 0 | 0 | 0 | 0 | 0 |

Number of Capacitors Showing Vlf Failure

For use with the present invention the pressure conditions were shown to cause the charging following deposition of an oxide layer, in particular during the power lift step. Additional studies were performed to better define the pressure above which no charging could be produced. At pressures below 1.2 Torr charging could be found. To understand the source of the charging, a study was conducted in which the Power Lift step was used but the wattage was reduced to zero and the pressure was dropped to 0.9 Torr. Under these conditions there was no degradation in Vlf.

Charges are created at the surface of the deposited oxide during the power lift step even though the power is only 50 watts. When the pressure within the chamber is high enough, the charges are bled off to the edge of the wafer and no damage is done. If the pressure drops below a specified level, however, there are insufficient molecules to make the charge transport efficient and the charge is not drained away. Under these conditions a charge buildup occurs at the oxide surface, especially at the center of the wafer where the charge drain off is at a minimum. The charge is reflected through the thin deposited oxide to the polysilicon electrode. When the accumulated charge produces a voltage that results in the dielectric strength of the oxide being exceeded, an oxide rupture occurs as the current is discharged to the substrate.

The deposition of a thin plasma oxide following sidewall etch was shown to be capable of causing charging sufficient to damage the gate oxide beneath the polysilicon electrode. The thickness of the deposited oxide, the pressure in the chamber, and the power level are all important factors in the charging mechanism. The tendency to create charging grew less as the deposited oxide thickness was increased. For thin oxides (30 nm or less) and power levels of 50 watts, a parameter found to be important during the post deposition step was pressure. The charge bleed off at low pressure (<1.2 Torr) was insufficient to affect the center of the wafer and resulted in damaged gate oxides. This study demonstrates that as the gate oxides become thinner charging conditions may be brought to surface which did not exist on prior oxide thicknesses.

Although the present invention and its advantages have been described in detail, it should be understood that various changes, substitutions and alterations can be made herein without departing from the spirit and scope of the invention as defined by the appended claims.

What is claimed is:

1. A method of forming a semiconductor device, comprising the steps of:
   providing an oxide region over a semiconductor body;
   depositing a further layer over said oxide region and said semiconductor body in a chamber using plasma enhanced deposition with an RF power sufficient to generate a plasma at a pressure above about 1.2 Torr;
   after said depositing step, maintaining a pressure in said chamber sufficient to permit bleeding off of charges on said oxide layer and concurrently reducing said RF power supplied to the chamber to a sufficiently low level to avoid further build up of charge on said oxide layer; and then
   further lowering said RF power to a power level below the power level required to generate said plasma while maintaining said pressure sufficient to cause bleeding off of charges on said oxide layer.

2. The method of claim 1, wherein said oxide is a gate oxide.

3. The method of claim 2, wherein said further layer is a TEOS layer.

4. The method of claim 3, wherein said pressure sufficient to cause bleeding off of charges on said oxide layer is 1.2 Torr.

5. The method of claim 2, wherein said pressure sufficient to cause bleeding off of charges on said oxide layer is 1.2 Torr.

6. The method of claim 1, wherein said further layer is a TEOS layer.

7. The method of claim 6, wherein said pressure sufficient to cause bleeding off of charges on said oxide layer is 1.2 Torr.

8. The method of claim 1, wherein said pressure sufficient to cause bleeding off of charges on said oxide layer is 1.2 Torr.

9. The method of claim 1, wherein said power level is 50 watts.

10. The method of claim 1 wherein a power lift step to release said semiconductor body from any electrostatic bonding is performed during said maintaining step.

11. A method of forming a semiconductor device, comprising the steps of:
    providing a gate oxide over a semiconductor body;
    forming a gate electrode over said gate oxide;
    depositing a layer over said gate electrode and said semiconductor body in a chamber using a RF power supplied to the chamber to generate a plasma at a pressure above about 1.2 Torr;
    after said depositing step, maintaining said pressure in said chamber sufficient to permit bleeding off of charges on said oxide layer and concurrently reducing said RF power to a sufficiently low level to avoid further build up of charge on said oxide layer; and
    then further reducing said RF power below the power level required to generate said plasma while maintaining said pressure sufficient to cause bleeding off of charges on said oxide layer.

12. The method of claim 11, wherein said layer is a TEOS layer.

13. The method of claim 12, wherein said pressure sufficient to cause bleeding off of charges on said oxide layer is 1.2 Torr.

14. The method of claim 11, wherein said pressure sufficient to cause bleeding off of charges on said oxide layer is 1.2 Torr.

15. The method of claim 11, wherein said specified power level is 50 watts.

16. The method of claim 11 wherein a power lift step to release said semiconductor body from any electrostatic bonding is performed during said maintaining step using a duration on the order of 20 seconds, an RF power on the order of 50 watts and a temperature on the order of 390° C.

17. A method of forming a semiconductor device, comprising the steps of:

provforming a gate oxide region over a semiconductor body;

forming a gate electrode over said gate oxide region;

forming sidewall spacers adjacent said gate electrode; and depositing an oxide layer over said gate electrode and semiconductor body by:

placing said semiconductor body in a plasma enhanced deposition chamber;

supplying a RF power to the chamber at a first power level to generate a plasma;

pressurizing said chamber to a first specified pressure level above about 1.2 Torr;

depositing the oxide layer using plasma enhanced deposition while maintaining said pressure level above about 1.2 Torr;

maintaining the pressure in said chamber above 1.2 Torr and concurrently reducing the RF power to a second power level sufficiently low to avoid build up of charge on said oxide layer;

then performing a power lift step to release said semiconductor body from any electrostatic bonding; and then, further reducing said RF power to a power level below the power level required to generate said plasma.

18. The method of claim 17, wherein said oxide layer is formed using TEOS.

19. The method of claim 17, wherein said second specified power level is 50 watts.

* * * * *